(12) United States Patent
Arimoto et al.

(10) Patent No.: US 8,803,098 B2
(45) Date of Patent: Aug. 12, 2014

(54) METHOD OF MANUFACTURING SCINTILLATOR PANEL, SCINTILLATOR PANEL, AND RADIATION IMAGE DETECTOR

(75) Inventors: Tadashi Arimoto, Hino (JP); Takafumi Yanagita, Hachioji (JP)

(73) Assignee: Konica Minolta Medical & Graphic, Inc., Hino-shi, Tokyo (JP)

( * ) Notice: Subject to any disclaimer, the term of this patent is extended or adjusted under 35 U.S.C. 154(b) by 241 days.

(21) Appl. No.: 13/322,719

(22) PCT Filed: Mar. 10, 2010

(86) PCT No.: PCT/JP2010/053977
§ 371 (c)(1),
(2), (4) Date: Nov. 28, 2011

(87) PCT Pub. No.: WO2010/140410
PCT Pub. Date: Dec. 9, 2010

(65) Prior Publication Data
US 2012/0068074 A1 Mar. 22, 2012

(30) Foreign Application Priority Data
Jun. 2, 2009 (JP) ................................ 2009-132887

(51) Int. Cl.
*G01T 1/20* (2006.01)
(52) U.S. Cl.
USPC .................................. 250/361 R; 250/483.1
(58) Field of Classification Search
USPC .......................................... 250/361 R, 483.1
See application file for complete search history.

(56) References Cited

U.S. PATENT DOCUMENTS

| 6,242,746 | B1 | 6/2001 | Teranuma et al. |
| 6,392,217 | B1* | 5/2002 | Teranuma et al. ......... 250/208.1 |
| 2002/0121606 | A1 | 9/2002 | Okada et al. |
| 2004/0200973 | A1* | 10/2004 | Ogawa ..................... 250/370.11 |
| 2007/0051896 | A1 | 3/2007 | Okada et al. |
| 2008/0099694 | A1* | 5/2008 | Shoji et al. ................. 250/483.1 |
| 2008/0111083 | A1* | 5/2008 | Kondo et al. ............ 250/370.11 |
| 2008/0203312 | A1* | 8/2008 | Kudo et al. .............. 250/370.11 |

(Continued)

FOREIGN PATENT DOCUMENTS

| JP | 11-186532 A | 7/1999 |
| JP | 11-287862 A | 10/1999 |

(Continued)

OTHER PUBLICATIONS

International Search Report dated Apr. 6, 2010 issued in International Appln. No. PCT/JP2010/053977.

(Continued)

*Primary Examiner* — David Porta
*Assistant Examiner* — Taeho Jo
(74) *Attorney, Agent, or Firm* — Holtz Holtz Goodman & Chick PC

(57) ABSTRACT

A method of manufacturing a scintillator panel in which no dust is generated when improving protrusions on the phosphor surface, resulting in no generation of image defects caused by the dust, to-provide a scintillator panel exhibiting excellent image quality and a radiation image detector thereof. The scintillator panel includes a support having a phosphor layer formed thereon. The method includes forming the phosphor layer on the support, and subsequently heat-treating the support and the phosphor layer which are sandwiched by two rigid plates under applied pressure.

22 Claims, 4 Drawing Sheets

(56) References Cited

U.S. PATENT DOCUMENTS

2008/0217550 A1* 9/2008 Shoji et al. .............. 250/370.11
2010/0314547 A1* 12/2010 Kudo et al. .................. 250/368
2011/0248186 A1* 10/2011 Kasai et al. ................ 250/483.1

FOREIGN PATENT DOCUMENTS

| JP | 2002-243859 A | 8/2002 |
| JP | 2003-344590 A | 12/2003 |
| JP | 2004-077371 A | 3/2004 |
| JP | 2006-335887 A | 12/2006 |
| JP | 2008-148217 A | 6/2008 |
| WO | WO 2005/038490 A1 | 4/2005 |

OTHER PUBLICATIONS

Extended European Search Report (EESR) dated Nov. 4, 2013 (in English) in counterpart European Application No. 10783196.8.
Japanese Office Action dated Aug. 20, 2013 (and English translation thereof) in counterpart Japanese Application No. 2011-518335.

* cited by examiner

METHOD OF MANUFACTURING SCINTILLATOR PANEL, SCINTILLATOR PANEL, AND RADIATION IMAGE DETECTOR

This application is a U.S. National Phase Application under 35 USC 371 of International Application PCT/JP2010/053977 filed Mar. 10, 2010.

TECHNICAL FIELD

The present invention relates to a method of manufacturing a scintillator panel, and the scintillator panel and a radiation image detector.

BACKGROUND

In the past, radiation images such as X-ray images have been widely used for diagnosing disease in clinical practice. Specifically, over a long period of history, radiation images formed via an intensifying screen-film system have accomplished high sensitivity and high image quality, whereby they are still utilized in clinical practice all over the world as an imaging system exhibiting high reliability and excellent cost performance at the same time. However, since the above-described image information is so-called analogue image information, and neither free image processing nor instantaneous electric transmission can be made in the similar way as in digital image information having been in progress in recent years.

Further, in recent years, a digital system radiation image detector, typified by computed radiography (CR) or the like has appeared. Since direct formation of digital radiation images is obtained by these and images can be directly displayed on an image display device such as a cathode tube, a liquid crystal panel or the like, the images are not necessarily formed on a photographic film. As a result, the above-described digital system X-ray image detector has reduced the need of image formation via a silver halide photographic system, and has significantly improved convenience of diagnostic action in hospitals and clinics. This computed radiography (CR) has been accepted at present in clinical practice, but not only sharpness is insufficient, but also space resolution is insufficient, whereby it has not achieved the same level as in a screen•film system.

On the other hand, further, a flat panel type radiation image detector (Flat Panel Detector: FPD) fitted with thin-film transistor (TFT) has been developed, for example, as a new digital X-ray image technology.

A scintillator panel made from X-ray phosphor exhibiting an emissive property produced by radiation in this flat panel type radiation image detector to convert radiation into visible light, but the use of a scintillator panel exhibiting high emission efficiency should be used in order to improve an SN ratio in radiography at a low dose. Generally, the emission efficiency of a scintillator panel depends on thickness of a phosphor layer (scintillator panel layer) and X-ray absorbance of the phosphor, but a thicker phosphor layer causes more scattering of luminescent light within the phosphor layer, resulting in lowered sharpness. Accordingly, sharpness desired for image quality determines the layer thickness.

Specifically, since cesium iodide (CsI) exhibits a relatively high conversion ratio of from X-rays to visible light, and a columnar crystal structure of the phosphor can readily be formed through vapor deposition, light guide effect inhibits scattering of luminescent light within the crystal, enabling an increase of the phosphor layer thickness.

However, since in the case of use of CsI alone, emission efficiency is low, one in which a mixture of CsI with sodium iodide (NaI) at any mixing ratio is deposited on a substrate via evaporation as sodium-activated cesium iodide (CsI:Na), or recently, one in which a mixture of CsI with thallium iodide (TlI) at any mixing ratio is deposited on a substrate via evaporation as thallium-activated cesium iodide (CsI:Tl) is subjected to annealing as a post-treatment to improve visible conversion efficiency, and the resulting is used as an X-ray phosphor.

As a method of manufacturing a scintillator panel, known is a method of forming a phosphor on a support such as an aluminum plate, an amorphous carbon plate or the like. In the case of the method of manufacturing a scintillator panel, it is generally known that deposited phosphor crystals caused by defects, dust and so forth on the support are anomaly grown, whereby protrusions are generated on the phosphor surface. Since such protrusions cause image defects, this should be improved.

As to the protrusions generated on such a phosphor surface, known are techniques of planarizing protrusions by squashing them with a jig, grinding them with a grinder for removal, cutting them with a cutting means, or the like (refer to Patent Document 1, for example).

PRIOR ART DOCUMENT

Patent Document

Patent Document 1: Japanese Patent O.P.I. (Open to Public Inspection) Publication No. 2002-243859

DISCLOSURE OF THE INVENTION

Problems to be Solved by the Invention

However, since those described in the above-described Patent Document 1 are associated with deformation of protrusions and fracture caused by removal of the protrusions, phosphor dust is generated. It is difficult to completely eliminate this dust, and output of a photoelectric conversion element in response to phosphor becomes inaccurate because of the dust remaining on the phosphor, leading to image defects, whereby produced is a problem such that it interferes with reproducibility of accurate radiation images.

The present invention has been made on the basis of the above-described problem, and it is an object of the present invention to provide a method of manufacturing a scintillator panel in which no dust is generated when improving protrusions on the phosphor surface, resulting in no generation of image defects caused by the dust, and to provide a scintillator panel exhibiting excellent image quality and a radiation image detector thereof.

Means to Solve the Problems

The above-described problem is accomplished by the following structures.

(Structure 1) A method of manufacturing a scintillator panel comprising a support and formed thereon, a phosphor layer, comprising the steps of forming the phosphor layer on the support, and subsequently heat-treating the support and the phosphor layer while the support and the phosphor layer are sandwiched by two rigid plates under applied pressure.

(Structure 2) A method of manufacturing a scintillator panel comprising a support exhibiting stiffness and formed thereon, a phosphor layer, comprising the steps of forming the phosphor layer on the support, and subsequently heat-treating the phosphor layer while the phosphor layer is sandwiched by the support and a rigid plate under applied pressure.

(Structure 3) The method of Structure 1 or 2, wherein the scintillator panel comprises a resin section excluding the phosphor layer, having a total thickness of 10 μm or more.

(Structure 4) The method of any one of Structures 1-3, wherein the support comprises polyimide as a main component.

(Structure 5) The method of any one of Structures 1-4, comprising the steps of storing the support and the phosphor layer while the support and the phosphor layer are sandwiched by the two rigid plates, or storing the phosphor layer while the phosphor layer is sandwiched by the support and the rigid plate in a plastic film container; and sealing and depressurizing the plastic film container to conduct the applied pressure.

(Structure 6) The method of any one of Structures 1-5, comprising the step of covering the phosphor layer by a protective layer.

(Structure 7) The method of Structure 6, wherein the protective layer comprises a resin film.

(Structure 8) The method of Structure 6, wherein the protective layer comprises a polyparaxylene resin film formed by a CVD method.

(Structure 9) The method of any one of Structures 1-8, wherein the phosphor layer comprises columnar crystals.

(Structure 10) The method of Structure 9, comprising the step of evaporating cesium iodide and an additive containing a thallium compound as raw materials to form the phosphor layer.

(Structure 11) A scintillator panel prepared by the method of any one of Structure 1-10.

(Structure 12) A radiation image detector comprising the scintillator panel of Structure 11 attached onto a photoelectric conversion panel comprising a photoelectric conversion element.

That is, in the case of the present invention, protrusions caused by anomalous growth of evaporated phosphor crystals, which are originated from dust or the like, are displaced to the resin layer side with no deformation to get stuck in the resin layer by conducting a sandwiching step with two rigid plates after forming a phosphor later and heat-treating the resulting under applied pressure to flatten the surface of the phosphor layer.

Effect of the Invention

By utilizing the present invention, it is possible to provide a method of manufacturing a scintillator panel in which no dust is generated when improving protrusions on the phosphor surface, resulting in no generation of image defects caused by the dust. This makes it possible to provide a scintillator panel exhibiting excellent image quality and a radiation image detector thereof.

DESCRIPTION OF THE PREFERRED EMBODIMENTS

Next, the present invention will be described in detail employing the present embodiments, but the present invention is not limited thereto.

Figure 1:
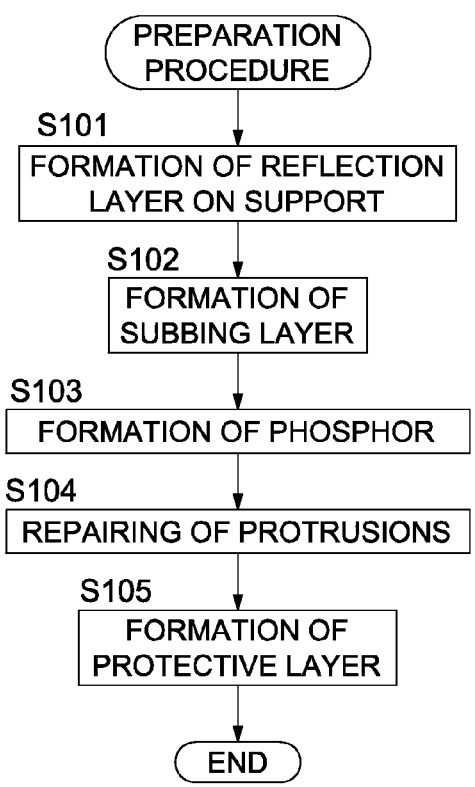
FIG. 1 is a flowchart showing an outline procedure to prepare a scintillator panel relating to the present embodiment.

FIG. 1 is a flowchart showing an outline procedure to prepare a scintillator panel relating to the present embodiment.

As to a scintillator panel in the present embodiment, a reflection layer is first formed on a support (Step S101), and a subbing layer is subsequently formed on the reflection layer (Step S102). Further, after a phosphor layer is formed on the subbing layer (Step S103), protrusions as defects generated on the phosphor layer are repaired (Step S104). Thereafter, a protective layer is formed so as to cover the phosphor layer (Step S105) to prepare a scintillator panel.

The scintillator panel prepared in accordance with the above-described procedure is attached onto a photoelectric conversion panel fitted with a photoelectric conversion element to prepare a radiation image detector.

In addition, repairing of protrusions (Step S104) and formation of a protective layer (Step S105) may be conducted in reverse order. As to the following FIGS. 2a, 2b and 2c, and FIGS. 3a, 3b, 3c and 3d, explanation will be made employing an example of the case when a protective layer is formed.

Next, each step of the flowchart shown in FIG. 1 will be described in detail.

Figure 2A:
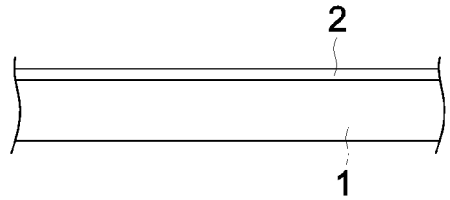
FIGS. 2a, 2b and 2c are diagrams showing preparation procedures of a scintillator panel relating to the present embodiment.
Figure 2B:
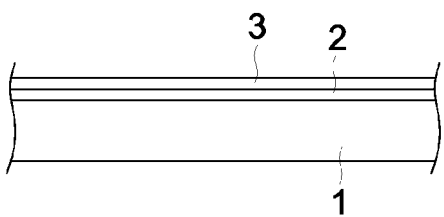
Figure 2C:
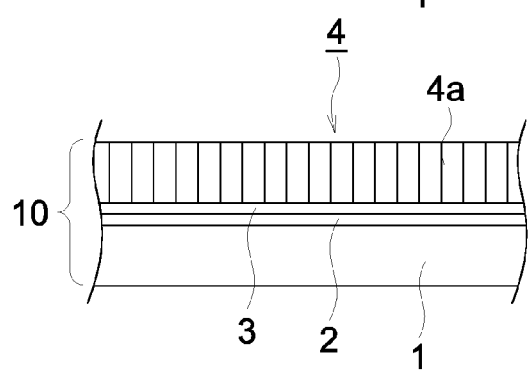

FIGS. 2a, 2b and 2c are diagrams showing preparation procedures of scintillator panel 10 relating to the present embodiment, and FIGS. 3a, 3b, 3c and 3d are diagrams showing other preparation procedures of scintillator panel 10 panel relating to the present embodiment. FIG. 4 is a diagram showing an outline structure of evaporator 60.

Next, preparation procedures of scintillator panel 10 in the present embodiments will be described.

(Formation of Reflection Layer)

As shown in FIG. 2a, reflection layer 2 is first formed on support 1.

In addition, support means a member which plays a predominant role in order to support a phosphor layer as a constituent element for a scintillator panel, and in the case of the present example, a resin film capable of being deformed via a heat treatment is preferably used for it.

Examples of the resin film include polyethylene terephthalate, polyethylene naphthalate, cellulose acetate, polyamide, polyimide, epoxy, polyamideimide, bismaleimide, a fluorine resin, acryl, polyurethane, nylon 12, nylon 6, polycarbonate, polyphenylenesulfide, polyethersulfone, polysulfone, polyetherimide, polyether ether ketone, a liquid crystal polymer and so forth.

As to a scintillator panel reflection layer 2 may be formed on the surface where at least a phosphor layer is vapor-deposited on support 1. When high luminance is demanded for a scintillator, luminance can be improved since emission of the phosphor can be efficiently taken out by providing reflection layer 2. Reflection layer 2 preferably has a surface reflectance of 80% or more, and more preferably has a surface reflectance of 90% or more. A material constituting reflection layer 2 preferably contains aluminum, silver, platinum, gold, copper, iron, nickel, chromium, cobalt, stainless steel or the like. Of these, a material containing aluminum or silver as a main component is specifically preferable in view of reflectance and corrosion resistance. When a metal thin film is composed of at least two layers, it is preferable in view of improved adhesion to a support that a lower layer is preferably is a layer containing Ni or Cr, or both of them. Further, a layer made of $SiO_2$, $TiO_2$ or the like may be formed on a metal thin film to further improve reflectance.

In addition, when high sharpness is demanded for a scintillator, reflection layer 2 may be omitted.

As a method of coating metal on a support, provided are evaporation, sputtering, attachment of a metal foil and so forth with no specific limitation, but sputtering is most preferable in view of tight adhesion.

In order to further improve adhesion of reflection layer 2 to support 1, an intermediate layer is preferably provided between reflection layer 2 and support 1. Examples of the material constituting an intermediate layer include easily adhesive polymers, for example, proteins such as gelatin, derivative gelatin, colloidal albumin, casein and so forth; cellulose compounds such as carboxymethyl cellulose, diacetyl cellulose, triacetyl cellulose and so forth; agar, sodium alginate; saccharide derivatives such as starch derivatives and so forth; synthetic hydrophilic colloids, for example, vinyl polymers and their copolymers such as polyvinyl alcohol, poly-N-vinylpyrrolidone, a polyester resin, a polyacrylic acid polymer, polyacrylamide or their derivatives and hydrolysates, polyvinyl acetate, polyacrylnitrile, polyacrylic acid ester and so forth, natural products such as rosin, shellac and so forth and their derivatives, and a large number of other synthetic resins. Further, usable is emulsion such as a styrene-butadiene copolymer, a polyacrylic acid, a polyacrylic acid ester and its derivative, polyvinyl acetate, a vinyl acetate-acrylic acid ester copolymer, polyolefin, an olefin-vinyl acetate copolymer or the like. In addition, also usable are a carbonate based resin, a polyester based resin, a urethane based resin, an epoxy based resin, and organic semiconductors such as polyvinyl chloride, polyvinylidene chloride and polypyrrole. Further, these binders can be used in combination with at least two kinds thereof. In addition, reflection layer 2 preferably has a thickness of 0.005-0.3 µm, and more preferably has a thickness of 0.01-0.2 µm in view of taking-out efficiency of luminescent light.

Besides these, a dissimilar metal to a reflection layer may be formed as an intermediate layer. Preferably used is at least one selected from the group consisting of nickel, cobalt, chromium, palladium, titanium, zirconium, molybdenum and tungsten, for example. Of these, nickel and chromium are further preferably used singly, or used in combination.
(Formation of Subbing Layer)

Next, as shown in FIG. 2b, in order to improve adhesion of a phosphor layer to a support, subbing layer 3 is preferably provided.

An easily adhesive polymer, for example, is usable for subbing layer 3. Subbing layer 3 preferably has a thickness of 0.2-5.0 µm; more preferably has a thickness of 0.5-4.0 µm; and still more preferably has a thickness of 0.7-3.5 µm.
(Formation of Phosphor Layer)

Next, as shown in FIG. 2c, phosphor layer 4 is formed. Since an evaporator is suitably used in this step, a brief overview of evaporator 60 shown in FIG. 4 will be first described.
<Evaporator>

As shown in 4, evaporator 60 is equipped with vacuum chamber 62 in the form of a box, and boat 63 for vacuum evaporation is provided in the inside of vacuum chamber 62.

Boat 63 is a member in which an evaporation source is to be filled, and an electrode is connected to boat 63. When an electric current is carried to boat 63 via the electrode, boat 63 is designed to be heated by Joule heat. During preparation of scintillator panel 10, a mixture containing cesium iodide and an activator compound is filled in boat 63, and the above-described mixture is designed to be heated and evaporated via electric current flow into boat 63.

In addition, as a member in which an evaporation source is to be filled, an aluminum crucible wound by a heater may be used.

Holder 64 to hold support 1 constituting a scintillator panel is provided directly above boat 63 inside vacuum chamber 62. Holder 64 is equipped with a heater (unshown in the figure), and support 1 placed on holder 64 is designed to be heated by operating the heater. When heating support 1, it is arranged to be designed that an adsorbate on the surface of support 1 is released and removed from the surface; formation of an impurity layer between support 1 and a phosphor layer (scintillator layer) formed on the surface of support 1 is inhibited; tight adhesion of the phosphor layer formed on the surface of support 1 to support 1 is enhanced; and film quality of the phosphor layer formed on the surface of support 1 is adjusted.

Holder 64 is provided with rotation mechanism 65 to rotate holder 64. Rotation mechanism 65 is equipped with rotating shaft 65a connected to holder 64 and a motor (unshown in the figure) as a driving source, and rotary shaft 65a is designed to be rotated in the state when holder 64 is opposed to boat 63, when the motor is driven.

Vacuum chamber 62 in evaporator 60 is equipped with vacuum pump 66 in addition to the above-described structure. Vacuum pump 66 evacuates the inside of vacuum chamber 62, and introduces gas into the inside of vacuum chamber 62. It is designed that the inside of vacuum chamber 62 is maintained under gas atmosphere at a given pressure, when operating vacuum pump 66.

As to formation of phosphor layer 4 shown in FIG. 2c, substrate 1 on which reflection layer 2 and subbing layer 3 are formed is placed on holder 64, and a powdered mixture containing cesium iodide and an additive containing a thallium compound is filled in boat 63. In this case, a distance between boat 63 and support 1 is set to 100-1500 mm, and a treatment of the after-mentioned evaporation process is preferably conducted while remaining within the setting range.

Next, the inside of vacuum chamber 62 is evacuated by operating vacuum pump 66 to obtain a vacuum atmosphere of 0.1 Pa or less in the inside of vacuum chamber 62. herein, "vacuum atmosphere" means atmosphere having a pressure of 100 Pa or less, and an atmosphere pressure of 0.1 Pa or less is preferable.

Thereafter, inert gas such as argon or the like is introduced into the inside of vacuum chamber 62, and vacuum atmosphere inside vacuum chamber 62 is maintained at 0.001-5 Pa, and preferably at 0.01-2 Pa. Support 1 having been placed on holder 64, which is opposed to boat 63, is rotated while heating by operating a heater for holder 64 and rotation mechanism 65. Temperature of support 1 on which phosphor layer 4 is to be formed is preferably set to a room temperature of 25° C. to 50° C. at the start of evaporation. During evaporation, a temperature of 100-300° C. is preferable, and a temperature of 150-250° C. is more preferable.

In this situation, an electric current is carried to boat 63 from an electrode, and a mixture containing cesium iodide and an additive containing a thallium compound is heated at about 700-800° C. for a predetermined duration to vaporize the mixture. As a result, a large number of columnar crystals 4a are sequentially grown on the surface of subbing layer 3 provided above support 1 to form phosphor layer 4 having a desired thickness.

Commonly known various phosphor materials are usable as the material to form phosphor layer 4, but since a conversion ratio from X-rays into visible light is considerably high, and phosphor can be formed easily in the form of a columnar crystal structure via evaporation, scattering of luminescent light inside crystals are inhibited by an optical guide effect, and thickness of the phosphor layer can be increased, whereby cesium iodide (CsI) is preferably used.

However, since CsI used singly exhibits low emission efficiency, various activated materials are added therewith. For example, one in which CsI and sodium iodide (NaI) are mixed at an arbitrary molar ratio provided as disclosed in Japanese Patent Examined Publication No. 54-35060. Further, for example, as to CsI disclosed in Japanese Patent O.P.I. Publication No. 2001-59899, CsI containing an activation material such as indium (In), thallium (Tl), lithium (Li), Potassium (K), rubidium (Rb), sodium (Na) or the like via evaporation is preferable.

Use of cesium iodide and an additive containing a thallium compound as raw material is preferable. That is, thallium-activated cesium iodide (CsI:Tl) having a wide range emission wavelength of 400-750 nm is preferable.

Various thallium compounds (compound having an oxidation number of $1^+$ and compound having an oxidation number of $3^+$) are usable as the thallium compound for an additive containing thallium iodine (TlI), thallium bromide (TlBr), thallium chloride (TlCl) and so forth are preferable.

Further, in order to obtain additives evenly present inside a phosphor layer (inside columnar crystals), a melting point of the thallium compound preferably falls within the range of 400-700° C. In addition, the melting point means a melting point at normal temperatures and pressures.

As to a phosphor layer in the present embodiment, a content of the additives should be set to a most appropriate amount depending on the purpose, performance and so forth, but in order to maintain emission luminance and property•function of cesium iodide, the additives have a content of 0.01-50 mol %, and preferably have a content of 0.1-10.0 mol %, based on the content of cesium iodide. In addition, in order to obtain properties of luminance and sharpness in a balanced manner, the phosphor layer preferably has a thickness of 100-800 μm, and more preferably has a thickness of 120-700 μm.

As described above, phosphor layer 4 is formed on support 1 to prepare scintillator panel 10.

In addition, as to scintillator panel 10, after forming a phosphor layer on a support layer larger than a product in size, a step of cutting the support into the product size for the scintillator is preferably arranged to be set. Productivity is improved by cutting plural pieces of products out of a large support on which a phosphor layer is formed. Examples of a method of cutting a scintillator panel include punching with a blade, press-cutting with a cutter, cutting with scissors, cutting with laser light and so forth.

As described above, protrusions caused by anomalous growth of evaporated phosphor crystals, which are originated from dust or the like, tend to be generated in the resulting scintillator panel 10, when forming phosphor layer 4 in FIG. 2c.

Next, repairing of protrusions in preparation procedures of scintillator panel 10 in the present embodiment will be described referring to FIGS. 3a, 3b, 3c and 3d.

(Repairing of Protrusions)

Figure 3A:
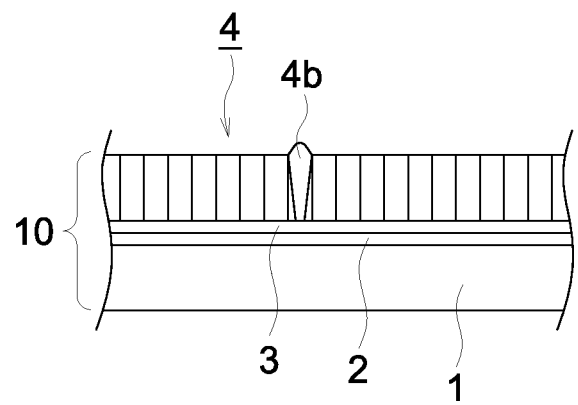
FIGS. 3a, 3b, 3c and 3d are diagrams showing other preparation procedures of a scintillator panel relating to the present embodiment.
Figure 4:
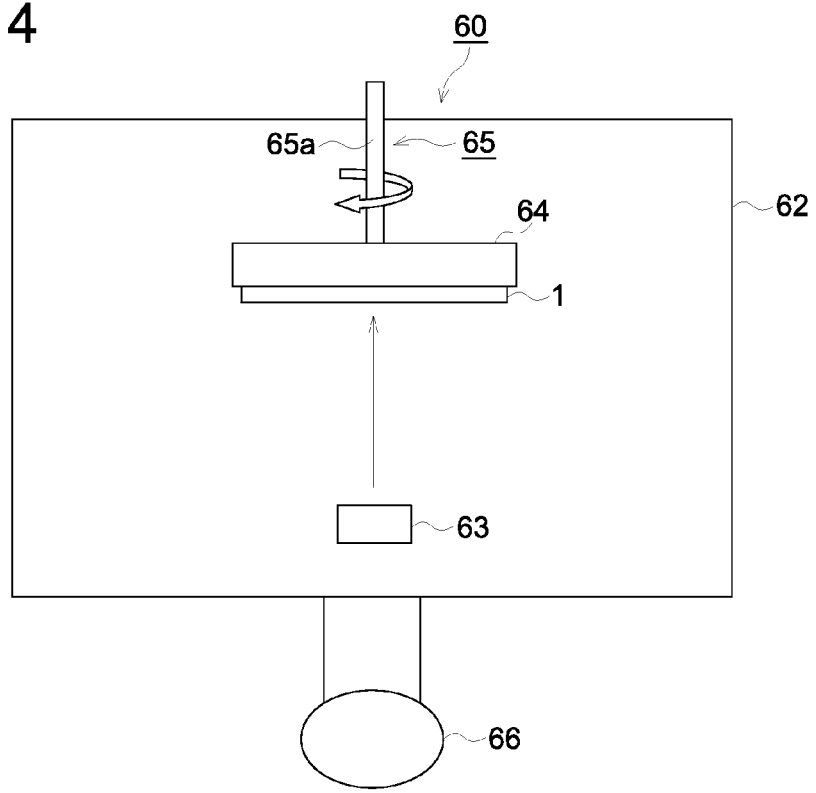
FIG. 4 is a diagram showing an outline structure of an evaporator.

Columnar crystals 4b as protrusions obtained via anomalous growth of evaporated phosphor crystals originated from dust or the like are formed in scintillator panel 10 shown in FIG. 3a. Columnar crystals 4b are repaired as described below.

Figure 3B:
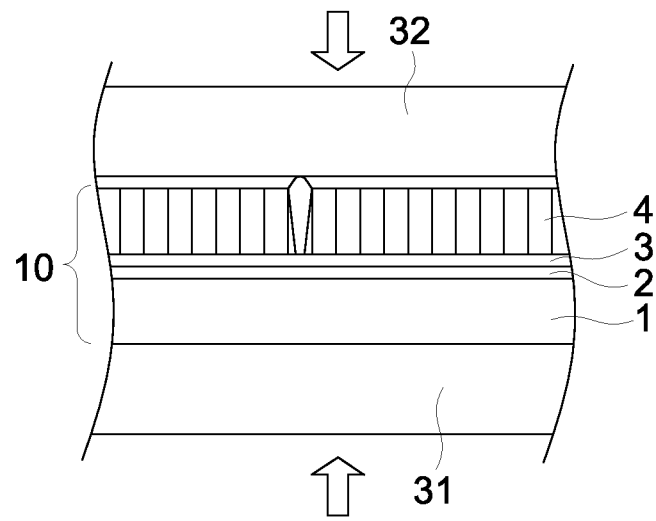

Scintillator panel 10 is sandwiched by rigid plate 31 on the back surface side of support 1 and rigid plate 32 on the front surface of phosphor layer 4 as shown in FIG. 3b, and rigid plates 31 and 32 are subjected to a heat treatment under applied pressure in the arrow direction in the figure.

As a method of applying a pressure, there are applied pressure by using a weight, mechanically applied pressure and so forth, and there is no specific limitation, but a sealing and depressurizing method employing a heat-resistant plastic film container in the form of a bag is preferable. More specifically, after sandwiching the scintillator panel with rigid plate 31 on the back surface side of support 1 and rigid plate 32 on the front surface side of phosphor layer 4, the resulting is stored in the plastic film container, and this container is sealed and depressurized to apply a pressure by atmospheric pressure. This method by which a pressure can be evenly applied to the rigid plate easily, and an amount of applied pressure can be easily adjusted by adjusting an amount of reduced pressure inside this container is preferable.

Further, an amount of applied pressure is preferably 0.001-10 MPa, and preferably 0.01-1 MPa. In the case of an amount of applied pressure of 0.001 or more, protrusions can be sufficiently displaced to the resin layer side. On the other hand, in the case of an amount of applied pressure of 10 MPa or less, damages to phosphor can be suppressed, whereby no image is deteriorated.

Heat treatment temperature is preferably 50-200° C., and more preferably 90-160° C. In the case of a heating temperature of 50° C. or more, protrusions can be easily displaced to the resin layer side. On the other hand, in the case of a heating temperature 200° C. or less, influence to images such as reduced luminance or the like can be suppressed.

In addition, "rigid plate" and "one exhibiting stiffness" in the present example, mean a plate having an elastic modulus of 10 GPa or more, and metal, glass, carbon, a composite material and so forth are usable with no specific limitation, but glass is preferable in view of excellent flatness of the surface. The flatness range of the rigid plate preferably has a center line average roughness Ra of 0-0.5 μm, and more preferably has a center line average roughness Ra of 0-0.1 μm.

Two rigid plates 31 and 32 sandwiching support 1 and phosphor layer 4 each may be made of material identical to each other, or different from each other. Further, rigid plate 31 provided on the support 1 side may be a support to support scintillator panel 10.

Scintillator panel 10 after removing rigid plates 31 and 32 from scintillator panel 10 after applying a pressure and conducting a heat treatment as described above results in the state shown in FIG. 3c.

Figure 3C:
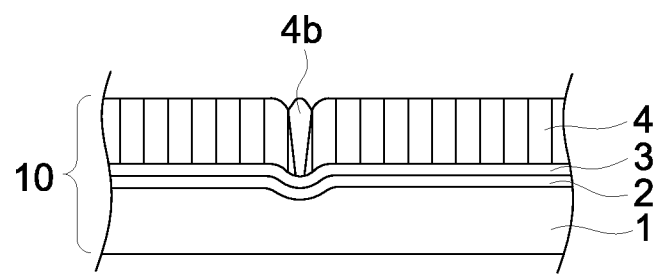

As shown in FIG. 3c, columnar crystal 4b as a protrusion, as it is, is displaced to the support 1 side, and pulled into subbing layer 3, reflection layer 2 and support 1. Protrusions on the front surface side which are displaced to the support 1 side end up with approximately uniform height, whereby the surface of phosphor layer 4 is flattened.

That is, repairing of protrusions in the present example means that height on the front surface side is uniformized by conducting a heat treatment under applied pressure after sandwiching scintillator panel 10 with rigid plates 31 and 32 to displace columnar crystal 4b to the resin section side on the support 1 side, and since protrusions are forcibly deformed or removed therefrom, generation of dust is possible to be eliminated via repairing.

In many cases, protrusions have a height of approximately 10-100 μm. Therefore, the resin section on the support 1 side preferably has a total thickness of 10 μm or more; more preferably has a total thickness of 50 μm or more; and still more preferably has a total thickness of 150 μm or more. In order to produce the effect of the present invention, there is specifically no upper limit to the total thickness of a resin layer, but the resin layer preferably has a total thickness of 2 mm or less in view of no deterioration of roentgenoparency.

(Formation of Protective Layer)

Figure 3D:
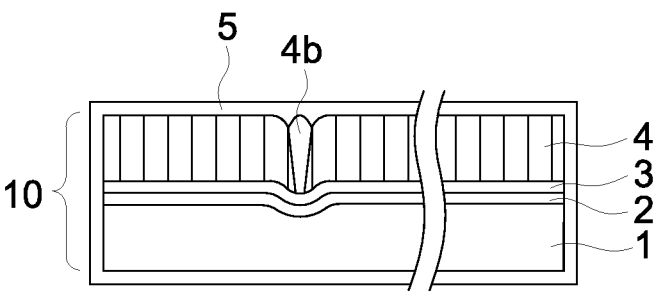

CsI to form phosphor layer 4 exhibiting moisture-absorption deliquences via absorption of water vapor when the CsI remains exposed. Accordingly, in order to avoid the foregoing, a protective layer is formed so as to cover a phosphor layer. FIG. 3d shows the state where protective layer 5 is formed after repairing the above-described protrusions.

In order to form a protective layer, it is preferable to form it with a resin film, or to form it by a CVD method.

In the case of a CVD method, a protective layer is preferably formed by covering the entire surface of a scintillator panel with a polyparaxylene resin film. Polyparaxylene is penetrated into gaps present in columnar crystals of CsI by using a CVD method to tightly attach a protective layer onto CsI.

The polyparaxylene resin film is not specifically limited, but the polyparaxylene resin film having a thickness of 1-30 μm is preferably formed on the surface of at least a phosphor layer. In the case of a polyparaxylene resin film having a thickness of 1 μm or more, higher moisture-preventing effect is produced, and in the case of a polyparaxylene resin film having a thickness of 30 μm or less, degradation of MTF can be suppressed. In addition, a polyparaxylene resin film having a thickness of 5-30 μm is more preferable, and a polyparaxylene resin film having a thickness of 5-10 μm is still more preferable.

Further, a resin film may be provided on a phosphor layer as a protective layer for the protective layer in another embodiment. In addition, "resin film" means a (ready-made) resin film formed in advance before preparing a scintillator panel, unless otherwise specifically mentioned.

The resin film as a protective layer preferably has a thickness of 12-100 μm, and more preferably has a thickness of 20-60 μm in view of protection of a phosphor layer, sharpness, moisture-resistance, workability and so forth. Further, a haze ratio is preferably 3-40%, and more preferably 3-10% in view of sharpness, unevenness of radiation images, manufacturing stability, workability and so forth. "Haze ratio" refers to values determined by NDH 5000W of Nippon Denshoku Industries Co., Ltd. Resin films having a desired haze ratio are appropriately selected from commercially available resin films, and possible to be easily obtained.

The resin film or the like as a protective layer preferably has a light transmittance of 70% or more at a wavelength of 550 nm in consideration of photoelectric conversion efficiency, emission wavelength and so forth, but since films having a light transmittance of 99% or more are industrially difficult to be obtained, a light transmittance of 70-99% is practically preferable.

Taking into consideration protection and deliquescence of the scintillator layer, the protective film preferably has a moisture permeability (measured in accordance with JIS Z0208) of 50 g/m$^2$·day or less (at 40° C. and 90% RH) and more preferably a moisture permeability (measured in accordance with JIS Z0208) of 10 g/m$^2$·day (at 40° C. and 90% RH) or less, but since no film having a moisture permeability of 0.01 g/m$^2$·day or less (at 40° C. and 90% RH) is industrially available, a moisture permeability (measured in accordance with JIS 20208) of 0.01-50 g/m$^2$·day (at 40° C. and 90% RH) is preferable, and a moisture permeability (measured in accordance with JIS Z0208) of 0.1-10 g/m$^2$·day (at 40° C. and 90% RH) is more preferable.

A radiation image detector in which scintillator panel 10 prepared by the above-described manufacturing method is attached onto a photoelectric conversion panel possessing a photoelectric conversion element will be described.

Figure 5:
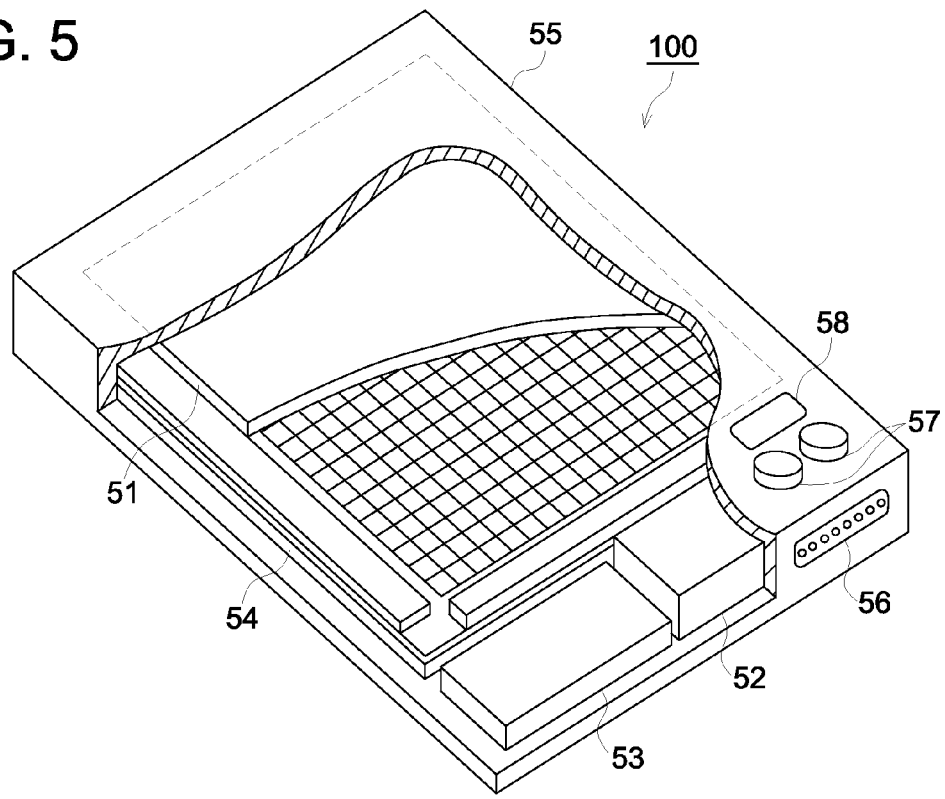
FIG. 5 is an oblique perspective view accompanied with a partly broken-out section showing an outline structure of a radiation image detector.
Figure 6:
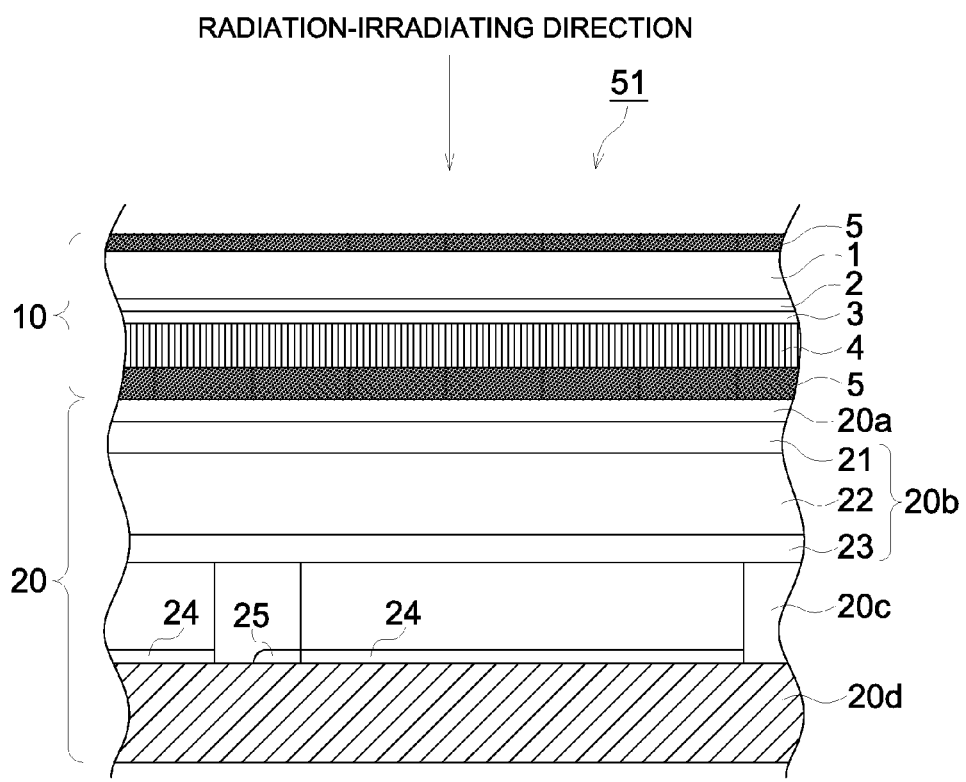
FIG. 6 an enlarged cross-sectional view of an imaging panel section.

FIG. 5 is an oblique perspective view accompanied with a partly broken-out section showing an outline structure of radiation image detector 100. FIG. 6 an enlarged cross-sectional view of imaging panel section 51.

As shown in FIG. 5, radiation image detector 100 is equipped with imaging panel 51, controller 52 to control action of radiation image detector 100, memory section 53 as a memory device to store image signals output from imaging panel 51 employing a rewritable dedicated memory (flash memory, for example), power supply section 54 as a power-supplying device to supply an electric power necessary to obtain image signals via driving of imaging panel 51 and so forth in enclosure 55. Enclosure 55 is provided with communication purpose connector 56 to communicate from radiation image detector 100 to the outside, operation section 57 to switch action of radiation image detector 100, display section 58 for displaying that imaging preparation of radiation images is completed, and a predetermined amount of image signals has been written in memory section 53, and so forth, if desired. In addition, radiation image detector 100 may be a communication section for wireless communication in place of connector 56 for communication.

As shown in FIG. 6, imaging panel 51 is equipped with scintillator panel 10, and photoelectric conversion panel 20 to output image signals via absorption of electromagnetic waves from scintillator panel 10.

Scintillator panel 10 is placed on the radiation-irradiating plane side, and is arranged to be designed so as to emit electromagnetic waves depending on intensity of incident radiation.

Photoelectric conversion panel 20 is provided on the surface opposite to the radiation-irradiated surface of scintillator panel 10 for radiation, and possesses barrier film 20a, photoelectric conversion element 20b, image signal output layer 20c and substrate 20d in this order from the side of scintillator panel 10 for radiation.

Bather film 20a is provided to separate scintillator panel 10 for radiation from other layers.

Photoelectric conversion element 20b possesses transparent electrode 21, charge generation layer 22 to generate charge by being excited with electromagnetic waves having been incident via transmission of transparent electrode 21, and counter electrode 23 as an electrode opposite to transparent electrode 21, and possesses transparent electrode 21, charge generation layer 22 and counter electrode 23 in this order from the side of bather film 20a.

Charge generation layer 22 is formed on the one surface side of transparent electrode 21 in the form of a thin film, and also contains an organic compound to be charge-separated by light as a photoelectrically convertible compound, and contains conductive compounds as an electron acceptor and an electron donor capable of generating charge, respectively. In charge generation layer 22, electron donors are excited upon incident electromagnetic waves to release electrons, and released electrons are moved to electron acceptors to generate charge inside charge generation layer 22, that is, holes and electrons as carriers.

Charge generation layer 22 preferably has a thickness of 10 nm or more (specifically, 100 nm or more) in view of acquisition of an amount of light absorption, and also preferably has a thickness of 1 μm or less (specifically, 300 nm or less) in view of no generation of too large electrical resistance.

Counter electrode 23 is placed on the side opposite to the plane on the side where electromagnetic waves of charge generation layer 22 are incident.

Further, a buffer layer may be provided between electrodes (transparent electrode 21 and counter electrode 23) sandwiching charge generation layer 22 in order to be acted as a buffer zone in such a way that charge generation layer 22 and each of these electrodes are not reacted.

Image signal output layer 20c is one to output a signal based on storage of charge obtained in photoelectric conversion element 20b as well as stored charge, and possesses condenser 24 as a charge storage element to store charge produced in photoelectric conversion element 20b for each pixel, and transistor 25 as an image signal output element to output stored charge as a signal.

Transistor 25 stores charge generated in photoelectric element 20b, and an accumulated electrode (unshown in the figure) as one electrode for condenser 24 is electrically connected to the transistor. Condenser 24 stores charge produced in photoelectric element 20b, and this stored charge us read by driving transistor 25. That is, the signal for each pixel of the radiation image can be output by driving transistor 25.

Substrate 20b serves as a support for imaging panel 51.

Next, action of radiation image detector 100 will be described.

As to radiation incident to radiation image detector 100, the radiation enters toward rge substrate 20d side from the scintillator panel 10 side for radiation.

By this, as to radiation incident to scintillator panel 10 for radiation, phosphor layer 4 in scintillator panel 10 absorbs energy of the radiation, and electromagnetic waves are emitted depending on the intensity. Electromagnetic waves entering photoelectric conversion panel 20, of emitted electromagnetic waves pass through bather film 2a in photoelectron conversion panel 20, and transparent electrode 21, and reach charge generation layer 22. Then, electromagnetic waves are absorbed in charge generation layer 22, and a pair of a hole and an electron (charge separation state) is formed depending on the intensity.

Thereafter, holes and electrons are carried to different electrodes, respectively, with internal electric field produced via application of a bias voltage from power supply section 54, and photocurrent flows.

Then, holes having been carried to the counter electrode 23 side are stored in condenser 24 of image signal output layer 20c. Stored holes output image signals when driving transistor 25 connected to condenser 24, and output image signals are recorder in memory section 53.

Since radiation image detector 100 explained herein is equipped with scintillator panel 10 prepared by the above-described manufacturing method, it becomes possible to provide a radiation image detector exhibiting no image defects but excellent image quality.

EXAMPLE

The following Examples will be described.

Preparation of Example 1

Silver was sputtered onto a resin layer made of polyimide (UPILEX S, produced by UBE INDUSTRIES. LTD.) having a thickness of 125 μm as a support so as to provide a reflection layer having a thickness of 70 nm, and a polyester resin (VYLON 200, produced by TOYOBO CO., LTD.) dissolved in methyethyl ketone was subsequently coated employing a spin coater, followed by drying to provide a subbing layer having a dry film thickness of 3.0 μm. Thereafter, the resulting was cut in 100 mm×100 mm size to prepare a support.

Next, phosphor (CsI: 0.003Tl) was vapor-deposited onto the surface on the subbing layer side of the support employing an evaporator shown in FIG. 4 to form a phosphor layer.

That is, the above-described phosphor raw material as an evaporation material was first filled in a resistance heating crucible (board), and a support was placed onto a metal frame of a rotation holder to adjust a distance between the support and an evaporation source to 400 mm.

After the inside of an evaporator was subsequently evacuated once, and a vacuum degree was adjusted to 0.5 Pa by introducing Ar gas therein, temperature was maintained at 200° C. while rotating the support at 10 mm. Next, resistance heating crucible (board) was heated to evaporate phosphor, and when the layer thickness reached 450 μm, evaporation thereof was terminated.

A glass plate (EAGLE2000 or EAGLE XG, produced by Corning Inc.) as a rigid plate was layered on each of the support surface and the phosphor surface, and the system was subjected to a heat treatment at 100° C. for 2 hours in a state where a weight load of 0.05 MPa was applied.

After removal of two rigid plates, a moisture-resistant film having the following structure was employed to protect the phosphor layer side.

NY 15///VMPET12///VMPET12///PET 12///CPP 20 when NY: Nylon,

PET: Polyethylene terephthalate,

CPP: Casting polypropylene, and

VMPET: Alumina-evaporated PET (commercially available product, produced by Toyo Metalizing Co., Ltd.). The number described behind the name of each resin represents layer thickness of the resin layer (in μm).

"///" represents a dry lamination adhesive layer of 3.0 μm in thickness. A two liquid reaction type urethane based adhesive was used as an adhesive for the utilized dry lamination.

The protective film on the back surface side of the support is a dry lamination film composed of a 30 μm thick CPP film, a 9 μm thick aluminum film, and a 188 μm thick polyethylene terephthalate film. Further, the adhesive layer has a thickness of 1.5 μm, and a two liquid reaction type urethane based adhesive was used in this case.

The peripheral portion was fused, and sealed by the above-described moisture-resistant film and a protective film employing an impulse sealer under reduced pressure to prepare a scintillator panel.

In addition, fusion was carried out so as to make a distance from a fused section to the peripheral portion of the phosphor plate to be 1 mm. As a heater for the impulse sealer used for fusion, used is a 3 mm wide heater.

A radiation image detector was prepared employing a scintillator panel prepared under the above-described conditions.

Preparation of Example 2

When a glass plate (EAGLE2000 or EAGLE XG, produced by Corning Inc.) was layered on each of the support surface and the phosphor surface, a hot melt sheet (NP608, produced by Sony Chemicals Corp.) was inserted between the back surface of the support and the glass plate produced by Corning Inc., and a heat treatment was carried out at 100° C. for 2 hours similarly in the state where a weight load of 0.05 MPa was applied. By conducting the treatment, the support and glass on the back surface are joined via the hot melt sheet.

After removal of the glass on the phosphor side, a radiation image detector was prepared similarly to Example 1, employing a scintillator panel in which a protective layer was formed.

Preparation of Example 3

A polyester resin (VYLON200, produced by TOYOBO CO. LTD.) dissolved in methylethyl ketone was coated on a high reflection aluminum plate (MIRO2 LCD, produced by ALANOD Aluminium-Veredlung GmbH & Co. KG) of 100 mm×100 mm in size as a support, followed by drying to provide a subbing layer having a dry layer thickness of 15 μm.

Phosphor (CsI: 0.003Tl) was subsequently vapor deposited onto the support surface employing an evaporator shown. in FIG. 4 under the same condition as in Example 1 to form a phosphor layer.

Thereafter, a glass plate (EAFLE2000 or EAGLE XG) was layered onto the surface on the phosphor side, and a heat treatment was carried out at 100° C. for 2 hours in the state where a weight load of 0.05 MPa was applied.

After removal of the glass, a radiation image detector was prepared under the same condition as in Example 1, employing a scintillator panel in which a protective layer was formed.

That is, in the case of Example 3, an aluminum plate having stiffness is used as a support, and is designed to serve as a rigid plate provided on the support side during application of pressure, and heating. In addition, a rigid plate may be used on the support side without employing the aluminum plate serving as a rigid plate provided on the support side.

Preparation of Example 4

A radiation image detector was prepared under the same condition as in Example 1, except that a resin layer as a support made of polyamide (UPILEX S, produced by UBE INDUSTRIES, LTD) having a thickness of 50 μm.

Preparation of Example 5

A polyester resin (VYLON200, produced by TOYOBO CO. LTD.) dissolved in methylethyl ketone was coated on a high reflection aluminum plate (MIRO2 LCD, produced by ALANOD Aluminium-Veredlung GmbH & Co. KG) of 100 mm×100 mm in size as a support, followed by drying to provide a subbing layer having a dry layer thickness of 3.0 μm.

A radiation image detector was prepared under the same condition as described in Example 3, except that the subbing layer was provided as explained above.

Preparation of Example 6

A polyester resin (VYLON 200, produced by TOYOBO CO., LTD.) dissolved in methyethyl ketone was coated on polyimide (UPILEX S, produced by UBE INDUSTRIES. LTD.) having a resin layer thickness of 125 μm as a support employing a spin coater, followed by drying to provide a subbing layer having a dry film thickness of 3.0 μm. Thereafter, the resulting was cut in 100 mm×100 mm size to prepare a support.

Next, phosphor (CsI: 0.003Tl) was vapor-deposited onto the surface on the subbing layer side of the support employing an evaporator shown in FIG. 4 to form a phosphor layer.

A glass plate (EAGLE2000 or EAGLE XG, produced by Corning Inc.) as a rigid plate was layered on each of the support surface and the phosphor surface, and the system was subjected to a heat treatment at 100° C. for 2 hours in a state where a weight load of 0.05 MPa was applied.

After removal of the rigid plate, it was exposed to the vapor obtained by sublimating polyparaxylene raw material (dix-C, produced by KISCO LTD.), and a scintillator panel was prepared on the entire surface of a phosphor layer by coating a polyparaxylene resin film having a thickness of 3 μm to similarly prepare a radiation image detector.

Preparation of Comparative Example 1

A scintillator panel was produced to prepare a radiation image detector similarly to Example 1, except that application of pressure with rigid plates and heating among the conditions in Example 1 were only omitted.

Seven conditions of Example 1, Example 2, Example 3, Example 4, Example 5, Example 6 and Comparative example 1 as described above, and evaluation results thereof are collectively shown in Table 1.

TABLE 1

| *a | Subbing layer (Resin layer) *c | | *d Material | Support Resin thickness (μm) | Adhesive layer to rigid plate *c | *d | Rigid plate Phosphor side | Support side | Total thickness of resin layers (μm) | The number of pixel defects (number) | *b |
|---|---|---|---|---|---|---|---|---|---|---|---|
| Ex. 1 | (*2) | 3 | Polyimide (*3) | 125 | — | 0 | Glass (*1) | Glass (*1) | 128 | 2 | A |
| Ex. 2 | (*2) | 3 | Polyimide (*3) | 125 | (*4) | 50 | Glass (*1) | Glass (*1) | 178 | 0 | A |
| Ex. 3 | (*2) | 15 | Aluminum (*5) | 0 | — | 0 | Glass (*1) | Aluminum (*5) | 15 | 7 | B |
| Ex. 4 | (*2) | 3 | Polyimide (*3) | 50 | — | 0 | Glass (*1) | Glass (*1) | 53 | 4 | A |
| Ex. 5 | (*2) | 3 | Aluminum (*5) | 0 | — | 0 | Glass (*1) | Aluminum (*5) | 3 | 25 | C |
| Ex. 6 | (*2) | 3 | Polyimide (*3) | 125 | — | 0 | Glass (*1) | Glass (*1) | 128 | 2 | A |
| Comp. 1 | (*2) | 3 | Polyimide (*3) | 125 | — | 0 | — | — | 128 | 78 | D |

Ex.: Example
Comp.: Comparative example
*a: Scintillator panel
*b: Evaluation
*c: Material
*d: Thickness (μm)
(*1): EAGLE2000 or EAGLE XG, produced by Corning Inc.
(*2): VYLON 200, produced by TOYOBO CO., LTD.
(*3): UPILEX S, produced by UBE INDUSTRIES. LTD.
(*4): NP608, produced by Sony Chemicals Corp. (hot melt sheet)
(*5): MIRO2 LCD, produced by ALANOD Aluminium-Veredlung GmbH & Co. KG The number of pixel defects is one obtained by counting the number of defects exceeding ±5% from the mean signal value of image data acquired by exposing a radiation image detector to X-rays having a tube voltage of 80 kVp.

As to evaluation criteria shown in Table 1, when the number of pixel defects was less than 5, the rank was set to "A";

when the number of defects was not less than 5 and less than 10, the rank was set to "B"; when the number of defects was not less than 10 and less than 30, the rank was set to "C"; and when the number of defects was not less than 30, the rank was set to "D".

As shown in Table 1, it can be understood that it is effective for reducing the number of pixel defects to conduct a heat treatment under applied pressure after conducting the sandwiching step with the rigid plates. Further, the total thickness of resin layers as the sum of the thickness of resin sections provided between a phosphor layer and a rigid plate on the support side is not less than 10 μm, and in the case of a radiation image detector fitted with a scintillator panel having been subjected to a heat treatment under applied pressure after conducting the sandwiching step with the rigid plates, the number of pixel defects becomes less than 10, whereby it is to be understood that an excellent radiation image detector exhibiting the reduced number of pixel defects has been obtained.

Further, in the case of a radiation image detector fitted with a scintillator panel possessing the steps of conducting a heat treatment under applied pressure after conducting the sandwiching step with the rigid plates, and having a total thickness of resin layers of 50 μm, the number of pixel defects becomes less than 5, whereby it is to be understood that a better radiation image detector has been obtained.

In addition, in the above-described embodiment, explanations have been made by utilizing an example in which a step of conducting a heat treatment under applied pressure after conducting the sandwiching step with the rigid plates is applied to one in which a phosphor layer is formed from columnar crystals, but the present invention is not limited thereto, and an example in which the step of conducting a heat treatment under applied pressure after conducting the sandwiching step with the rigid plates is also applicable to a coating type scintillator panel in which phosphor particles are mixed with binder to coat the resulting on a support.

EXPLANATION OF NUMERALS

1 Support
2 Reflection layer
3 Subbing layer
4 Phosphor layer
5 Protective layer
10 Scintillator panel
20 Photoelectric conversion panel
20b Photoelectric conversion element
31, 32 Rigid plate
51 imaging panel
60 Evaporator
100 Radiation image detector

The invention claimed is:

1. A method of manufacturing a scintillator panel comprising a support having a phosphor layer formed thereon, the method comprising:
forming the phosphor layer on the support, and
subsequently heat-treating the support and the phosphor layer while the support and the phosphor layer are sandwiched by two rigid plates under applied pressure.

2. The method of claim 1,
wherein the scintillator panel comprises a resin section excluding the phosphor layer, and the resin section has a total thickness of 10 μm or more.

3. The method of claim 1,
wherein the support comprises polyimide as a main component.

4. The method of claim 1, further comprising:
storing the support and the phosphor layer sandwiched by the two rigid plates in a plastic film container; and
sealing and depressurizing the plastic film container to conduct the applied pressure.

5. The method of claim 1, further comprising covering the phosphor layer with a protective layer.

6. The method of claim 5,
wherein the protective layer comprises a resin film.

7. The method of claim 5,
wherein the protective layer comprises a polyparaxylene resin film formed by a CVD method.

8. The method of claim 1,
wherein the phosphor layer comprises columnar crystals.

9. The method of claim 8, further comprising:
evaporating cesium iodide and an additive containing a thallium compound as raw materials to form the phosphor layer.

10. A scintillator panel prepared by the method of claim 1.

11. A radiation image detector comprising the scintillator panel of claim 10 attached onto a photoelectric conversion panel comprising a photoelectric conversion element.

12. A method of manufacturing a scintillator panel comprising a support exhibiting stiffness and having a phosphor layer formed thereon, the method comprising:
forming the phosphor layer on the support, and
subsequently heat-treating the phosphor layer while the phosphor layer is sandwiched by the support and a rigid plate under applied pressure.

13. The method of claim 12,
wherein the scintillator panel comprises a resin section excluding the phosphor layer, and the resin section has a total thickness of at least 10 μm.

14. The method of claim 12,
wherein the support comprises polyimide as a main component.

15. The method of claim 12, further comprising:
storing the phosphor layer sandwiched by the support and the rigid plate in a plastic film container; and
sealing and depressurizing the plastic film container to conduct the applied pressure.

16. The method of claim 12, further comprising covering the phosphor layer with a protective layer.

17. The method of claim 16,
wherein the protective layer comprises a resin film.

18. The method of claim 16,
wherein the protective layer comprises a polyparaxylene resin film formed by a CVD method.

19. The method of claim 12,
wherein the phosphor layer comprises columnar crystals.

20. The method of claim 19, further comprising:
evaporating cesium iodide and an additive containing a thallium compound as raw materials to form the phosphor layer.

21. A scintillator panel prepared by the method of claim 12.

22. A radiation image detector comprising the scintillator panel of claim 21 attached onto a photoelectric conversion panel comprising a photoelectric conversion element.

* * * * *